United States Patent
Chen et al.

(10) Patent No.: US 10,482,834 B2
(45) Date of Patent: Nov. 19, 2019

(54) PIXEL CIRCUIT, DISPLAY DEVICE, DISPLAY APPARATUS AND DRIVING METHOD

(71) Applicants: BOE TECHNOLOGY GROUP CO., LTD., Beijing (CN); BEIJING BOE DISPLAY TECHNOLOGY CO., LTD., Beijing (CN)

(72) Inventors: Pengming Chen, Beijing (CN); Weitao Chen, Beijing (CN); Bin Zhang, Beijing (CN); Dianzheng Dong, Beijing (CN); Kan Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/552,284

(22) PCT Filed: Feb. 20, 2017

(86) PCT No.: PCT/CN2017/074102
§ 371 (c)(1),
(2) Date: Aug. 20, 2017

(87) PCT Pub. No.: WO2018/018883
PCT Pub. Date: Feb. 1, 2018

(65) Prior Publication Data
US 2018/0240426 A1    Aug. 23, 2018

(30) Foreign Application Priority Data
Jul. 25, 2016   (CN) .......................... 2016 1 0591261

(51) Int. Cl.
*G09G 3/34*     (2006.01)
*G09G 3/36*     (2006.01)
(Continued)

(52) U.S. Cl.
CPC ..... *G09G 3/3674* (2013.01); *G02F 1/136213* (2013.01); *G09G 3/3607* (2013.01);
(Continued)

(58) Field of Classification Search
USPC ....... 345/84, 92, 98, 204, 690, 590, 213, 76, 345/205, 89, 95, 100; 349/143
See application file for complete search history.

(56) References Cited

U.S. PATENT DOCUMENTS

2005/0253803 A1   11/2005   Thompson et al.
2007/0001984 A1*   1/2007   Kumagai ............. G09G 3/3674
                                                 345/98
(Continued)

FOREIGN PATENT DOCUMENTS

| CN | 101261810 A | 9/2008 |
| CN | 104952406 A | 9/2015 |
| CN | 106057154 A | 10/2016 |

OTHER PUBLICATIONS

International Search Report and Written Opinion dated May 24, 2017, for corresponding PCT Application No. PCT/CN2017/074102.

*Primary Examiner* — Thuy N Pardo
(74) *Attorney, Agent, or Firm* — Kinney & Lange, P.A.

(57) ABSTRACT

Embodiments of the present disclosure relate to a pixel circuit, comprising: a liquid crystal capacitor; a selection unit having a first input terminal for receiving a row control signal and a second input terminal for receiving a column control signal, and configured to generate a selection signal indicating whether to select the liquid crystal capacitor according to the row control signal and the column control signal and output the selection signal via an output terminal of the selection unit; and a grayscale voltage writing unit having a first input terminal connected to the output terminal of the selection unit, a second input terminal for receiving a
(Continued)

grayscale voltage, a first output terminal connected to a first terminal of the liquid crystal capacitor, and a second output terminal connected to a first voltage, and configured to write a corresponding grayscale voltage of multiple grayscale voltages into the liquid crystal capacitor when the selection signal indicates that the liquid crystal capacitor is selected.

20 Claims, 7 Drawing Sheets

(51) Int. Cl.
    *G02F 1/1362*     (2006.01)
    *H01L 27/12*     (2006.01)

(52) U.S. Cl.
    CPC ......... *G09G 3/3688* (2013.01); *H01L 27/124* (2013.01); *G09G 2310/0264* (2013.01); *G09G 2320/0223* (2013.01)

(56) References Cited

U.S. PATENT DOCUMENTS

| | | | |
|---|---|---|---|
| 2007/0013634 A1* | 1/2007 | Saiki | G09G 3/3674 345/98 |
| 2007/0013635 A1* | 1/2007 | Ito | G09G 3/3674 345/98 |
| 2009/0058876 A1* | 3/2009 | Wang | G09G 3/3413 345/590 |
| 2011/0090184 A1* | 4/2011 | Yamazaki | G09G 3/20 345/204 |
| 2012/0268707 A1* | 10/2012 | Yamashita | G09G 3/3607 349/143 |
| 2013/0069855 A1* | 3/2013 | Nakanishi | G09G 3/3655 345/92 |
| 2015/0279333 A1* | 10/2015 | Saitoh | G09G 3/20 345/213 |
| 2016/0140912 A1* | 5/2016 | Im | G09G 3/003 345/690 |
| 2016/0148563 A1* | 5/2016 | Tsuge | G09G 3/3225 345/76 |
| 2016/0155400 A1* | 6/2016 | Namkung | G09G 3/3614 345/205 |
| 2016/0189641 A1* | 6/2016 | Son | G09G 3/3607 345/205 |
| 2018/0182780 A1* | 6/2018 | Umezaki | G11C 19/28 345/84 |

* cited by examiner

60

S601 — a respective corresponding grayscale voltage of multiple grayscale voltages is sequentially written into the liquid crystal capacitor in a respective corresponding pixel circuit of the multiple pixel circuits, wherein amplitudes of the multiple grayscale voltages are in one-to-one correspondence with all gray levels of the image to be displayed, and all the multiple grayscale voltages are written sequentially in a frame period

Fig. 6

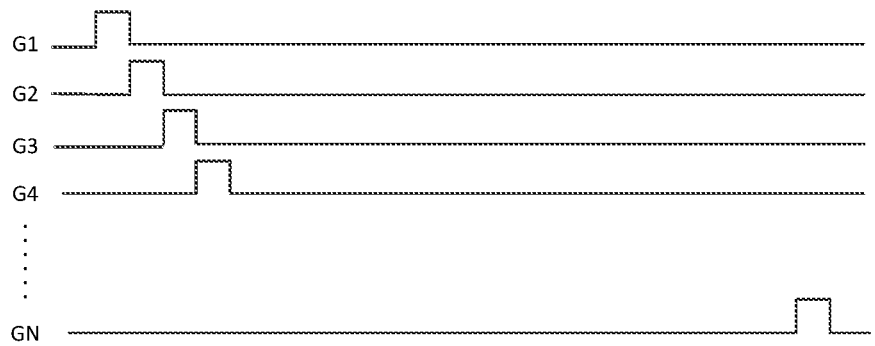

Fig. 7

| L0 | L1 | L0 |
|----|----|----|
| L1 | L0 | L2 |
| L1 | L3 | L3 |
| L3 | L0 | L0 |

Fig. 8

PIXEL CIRCUIT, DISPLAY DEVICE, DISPLAY APPARATUS AND DRIVING METHOD

CROSS-REFERENCE TO RELATED APPLICATION(S)

This application is the national phase of PCT Application No. PCT/CN2017/074102 filed on Feb. 20, 2017, which in turn claims priority to the Chinese Patent Application No. 201610591261.4, filed on Jul. 25, 2016, which is incorporated herein by reference in its entirety.

TECHNICAL FIELD

The embodiments of the present disclosure relate to the field of liquid crystal display, and more particularly, to a pixel circuit, a display device, a display apparatus, a method for driving a pixel circuit, and a method for driving a display panel.

BACKGROUND

Conventional methods for driving a liquid crystal display comprise progressive scanning or interlaced scanning in which a grayscale voltage to be displayed is written into a pixel electrode in a progressive or interlaced manner using a source driver Integrated Circuit (IC). An electric field is formed between the pixel electrode and a common electrode voltage Vcom to drive the liquid crystal to rotate accordingly, thereby displaying a corresponding grayscale. However, the conventional methods for driving a liquid crystal display may introduce a Resistor-Capacitor (RC) delay, which is particularly significant for high-resolution or ultra-high resolution liquid crystal display. This is also one of bottlenecks for design of an ultra-high resolution liquid crystal display panel. In addition, with the increase in resolution, there will also be a problem that the pixel circuit may not be charged sufficiently.

SUMMARY

The embodiments of the present disclosure propose a pixel circuit, a display device, a display apparatus, a method for driving a pixel circuit, and a method for driving a display device.

According to an aspect of the embodiments of the present disclosure, there is provided a pixel circuit, comprising:

a liquid crystal capacitor;

a selection unit having a first input terminal for receiving a row control signal and a second input terminal for receiving a column control signal, and configured to generate a selection signal indicating whether to select the liquid crystal capacitor according to the row control signal and the column control signal and to output the selection signal via an output terminal of the selection unit; and a grayscale voltage writing unit having a first input terminal connected to the output terminal of the selection unit, a second input terminal for receiving a grayscale voltage, a first output terminal connected to a first terminal of the liquid crystal capacitor, and a second output terminal connected to a first voltage, and configured to write a corresponding grayscale voltage of multiple grayscale voltages into the liquid crystal capacitor when the selection signal indicates that the liquid crystal capacitor is selected.

Alternatively, a lowest grayscale voltage among the multiple grayscale voltages has magnitude of 0, and a highest grayscale voltage among the multiple grayscale voltages has magnitude corresponding to a highest gray level of an image to be displayed.

Alternatively, the column control signal depends on a gray level of an image to be displayed.

Alternatively, the grayscale voltage writing unit comprises a writing module and a reset module, wherein the writing module has a control terminal connected to the output terminal of the selection unit, an input terminal for receiving the corresponding grayscale voltage, and an output terminal connected to the first terminal of the liquid crystal capacitor; and the reset module has an input terminal for receiving a reset voltage and an output terminal connected to the writing module, and configured to reset the writing module under the control of the reset voltage.

Alternatively, the selection unit comprises a first thin film transistor (TFT) and a second TFT, wherein the first TFT has a control terminal and an input terminal both connected to the row control signal, and an output terminal connected to an input terminal of the second TFT, and the second TFT has a control terminal connected to the column control signal and an output terminal connected to the first input terminal of the grayscale voltage writing unit for outputting the selection signal.

Alternatively, the writing module comprises a third TFT having a control terminal connected to the output terminal of the second TFT, an input terminal for receiving the corresponding grayscale voltage, and an output terminal connected to the first terminal of the liquid crystal capacitor, and a second of the liquid crystal capacitor is connected to a second voltage; the reset module comprises a fourth TFT and a first capacitor, wherein the fourth TFT has a control terminal for receiving the reset voltage, an input terminal connected to both the first terminal of the first capacitor and the output terminal of the second TFT, and an output terminal connected to the first voltage; and a second terminal of the first capacitor is connected to both the first terminal of the liquid crystal capacitor and the output terminal of the third TFT.

According to another aspect of the embodiments of the present disclosure, there is provided a display device, comprising at least two pixel circuits according to the embodiments of the present disclosure.

According to another aspect of the embodiments of the present disclosure, there is provided a display apparatus comprising a timing controller and the display device according to the embodiments of the present disclosure, wherein the timing controller generates the column control signal according to a gray level of an image to be displayed.

According to another aspect of the embodiments of the present disclosure, there is provided a method for driving the pixel circuit according to the embodiments of the present disclosure, comprising:

in a selection phase, generating a selection signal according to the row control signal and the column control signal;

in a grayscale voltage writing phase, writing a corresponding grayscale voltage of multiple grayscale voltages to the liquid crystal capacitor if the selection signal indicates that the liquid crystal capacitor is selected, otherwise, not writing the corresponding grayscale voltage to the liquid crystal capacitor; and in a reset phase, resetting the grayscale voltage writing unit.

Alternatively, the selection unit comprises a first TFT and a second TFT, and the grayscale voltage writing unit comprises a third TFT, a fourth TFT and a first capacitor, wherein in the selection phase, the first TFT is turned on, and the second TFT is turned on, so that a selection signal indicating that the liquid crystal capacitor is selected is generated; and in the grayscale voltage writing phase, the third TFT is turned on due to the selection signal, so that the corresponding grayscale voltage is written into the liquid crystal capacitor.

Alternatively, the selection unit comprises a first TFT and a second TFT, and the grayscale voltage writing unit comprises a third TFT, a fourth TFT and a first capacitor, wherein in the selection phase, the first TFT is turned on, and the second TFT is turned off, so that a selection signal indicating that the liquid crystal capacitor is not selected is generated; and in the grayscale voltage writing phase, the third TFT is turned off due to the selection signal, so that the corresponding grayscale voltage is not written into the liquid crystal capacitor.

Alternatively, in the reset phase, when a reset voltage is applied to the fourth TFT, the fourth TFT is turned on to cause the first capacitor to discharge, so that the third TFT is turned off, wherein the reset voltage is applied each time when the corresponding grayscale voltage changes.

According to another aspect of the embodiments of the present disclosure, there is provided a method for driving the display device according to the embodiments of the present disclosure, comprising:

sequentially writing a respective corresponding grayscale voltage of multiple grayscale voltages into liquid crystal capacitors in respective corresponding pixel circuits of the multiple pixel circuits, wherein amplitudes of the multiple grayscale voltages are in one-to-one correspondence with all gray levels of the image to be displayed, and all the multiple grayscale voltages are written sequentially in a frame period.

BRIEF DESCRIPTION OF THE DRAWINGS

The foregoing and other purposes, features and advantages of the embodiments of the present disclosure will become more apparent from the following description of exemplary embodiments of the present disclosure when taken in conjunction with the accompanying drawings in which:

FIG. 6 illustrates a flowchart of a method for driving a display panel according to an embodiment of the present disclosure;

FIG. 7 illustrates a waveform diagram of row control signals according to an embodiment of the present disclosure;

FIG. 8 illustrates an example of grayscale voltages of an image to be displayed according to an embodiment of the present disclosure.

DETAILED DESCRIPTION

Figure 1:
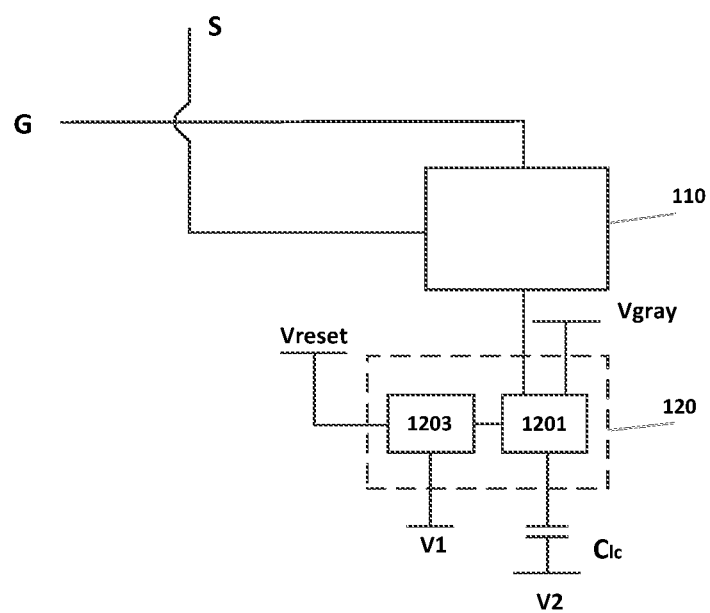
FIG. 1 is a schematic block diagram showing a pixel circuit according to an embodiment of the present disclosure.

Hereinafter, exemplary embodiments of the present disclosure will be described in detail with reference to the accompanying drawings. Throughout the accompanying drawings, the same elements are denoted by the same or similar reference numerals. In the following description, some specific embodiments are for illustrative purposes only and are not to be construed as limiting the present disclosure, but merely examples of the embodiments of the present disclosure. The conventional structure or construction will be omitted when it may cause confusion with the understanding of the present disclosure. It should be noted that shapes and sizes of various components in the figures do not reflect true sizes and proportions, but only illustrate contents of the embodiments of the present disclosure.

It should also be noted that those skilled in the art will appreciate that terms "A is connected with B" and "A is connected to B" may be that A is directly connected with B, or A is connected with B via one or more other components. In addition, "connected with" and "connected to" herein may be "physically electrically connected", or may be "electrically coupled with" or "electrically coupled to" etc.

It will be appreciated by those skilled in the art that switch transistors used in all embodiments of the present disclosure may be thin film transistors or field effect transistors or other devices having the same characteristics. Alternatively, the thin film transistors used in the embodiments of the present disclosure may be oxide semiconductor transistors. As used herein, the term "control terminal" refers to a gate of a transistor, the term "input terminal" refers to one of a source and a drain of the transistor, and the term "output terminal" refers to the other of the source and the drain of the transistor. As the source and the drain of the switch transistor used here are symmetrical, the source and the drain are interchangeable.

In addition, the following embodiments are described by taking switch transistors being N-type transistors as an example, that is, when a gate voltage of a switch transistor is at a high level, the switch transistor is turned on, and when the gate voltage is at a low level, the switch transistor is turned off. It will be appreciated by those skilled in the art that P-type transistors may be used as the switch transistors, that is, when a gate voltage of the switch transistor is at a low level, the switch transistor is turned on, and when the gate voltage is at a high level, the switch transistor is turned off. In this case, corresponding modifications of the circuit structure will be apparent to those skilled in the art.

FIG. 1 illustrates a schematic block diagram of a pixel circuit according to an embodiment of the present disclosure. As shown in FIG. 1, the pixel circuit 10 according to the embodiment of the present disclosure may comprise:

a liquid crystal capacitor $C_{ld}$;

a selection unit 110 having a first input terminal for receiving a row control signal G and a second input terminal for receiving a column control signal S, and configured to generate a selection signal indicating whether to select the liquid crystal capacitor according to the row control signal and the column control signal and output the selection signal via an output terminal of the selection unit; and a grayscale voltage writing unit 120 having a first input terminal connected to the output terminal of the selection unit, a second input terminal for receiving a grayscale voltage Vgray, which could be one of multiple grayscale voltages, a first output terminal connected to the first terminal of the liquid crystal capacitor $C_{ld}$, and a second output terminal connected to a first voltage V1, and configured to write a corresponding grayscale voltage of the multiple grayscale voltages into the liquid crystal capacitor when the selection signal indicates that the liquid crystal capacitor is selected.

Alternatively, in a frame display period, amplitude of respective grayscale voltages to be written into liquid crystal capacitors may increase or decrease progressively in time. For example, the amplitude of the respective grayscale voltages increases progressively from a lowest grayscale voltage 0 to a highest grayscale voltage of the multiple grayscale voltages, wherein magnitude of the highest grayscale voltage corresponds to a highest gray level of an image to be displayed. Alternatively, the amplitude of the respective grayscale voltages decreases progressively from the highest grayscale voltage to the lowest grayscale voltage 0. Of course, it is possible to sequentially arrange the respective grayscale voltages to be written into liquid crystal capacitors in another order, as long as one corresponding grayscale voltage is written into pixel circuits in corresponding positions at a time until all the multiple grayscale voltages are written in the frame display period.

As shown in FIG. 1, the grayscale voltage writing unit 120 may comprise a writing module 1201 and a reset module 1203. The writing module 1201 has a control terminal connected to the output terminal of the selection unit, an input terminal for receiving the corresponding grayscale voltage, and an output terminal connected to the first terminal of the liquid crystal capacitor $C_{ld}$. The reset module 1203 has an input terminal for receiving a reset voltage Vreset and an output terminal connected to the writing module 1201, and configured to reset the writing module 1201 under the control of the reset voltage Vreset.

Figure 2:
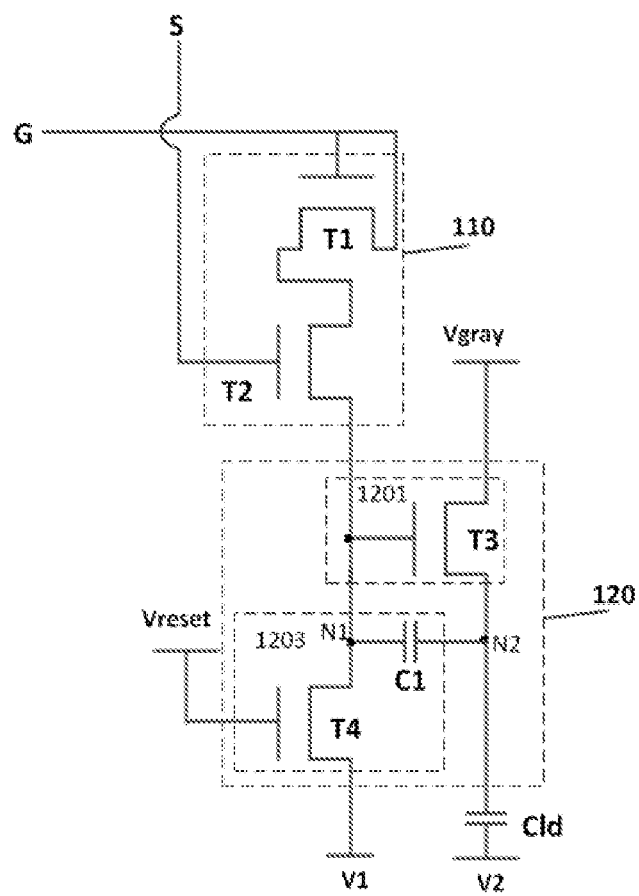
FIG. 2 is an exemplary circuit diagram showing a pixel circuit according to an embodiment of the present disclosure.

FIG. 2 illustrates an exemplary circuit diagram of the pixel circuit shown in FIG. 1 according to the embodiment of the present disclosure. Next, a specific implementation of the pixel circuit according to the embodiment of the present disclosure will be described in detail with reference to FIGS. 1 and 2.

As shown in FIG. 2, the selection unit 110 comprises a first transistor T1 and a second transistor T2, wherein the first transistor T1 has a control terminal and an input terminal connected to the row control signal G and an output terminal connected to an input terminal of T2, and T2 has a control terminal connected to the column control signal S and an output terminal connected to the first input terminal of the grayscale voltage writing unit 120 so as to provide the selection signal to the grayscale voltage writing unit 120.

The writing module 1201 in the grayscale voltage writing unit 120 comprises a third transistor T3 having a control terminal connected to the output terminal of the second transistor T2, an input terminal for receiving the grayscale voltage Vgray, and an output terminal connected to the first terminal of the liquid crystal capacitor $C_{ld}$, wherein a second terminal of the liquid crystal capacitor $C_{ld}$ is connected to a second voltage V2. The reset module 1203 in the grayscale voltage writing unit 120 may comprise a fourth transistor T4 and a first capacitor C1, wherein the fourth transistor T4 has a control terminal for receiving the reset voltage Vreset, an input terminal connected to a first terminal of the first capacitor C1 and the output terminal of the second transistor T2 at a node N1, and an output terminal connected to the first voltage V1, and a second terminal of the first capacitor C1 is connected to the first terminal of the liquid crystal capacitor $C_{ld}$ and the output terminal of the third transistor T3 at a node N2.

As shown in FIG. 2, the output terminal of the fourth transistor T4 is connected to the first voltage V1, and it will be understood by those skilled in the art that the first voltage V1 may be ground or a low voltage Vss. As shown in FIG. 2, the second terminal of the liquid crystal capacitor $C_{ld}$ is connected to the second voltage V2, and it will be understood by those skilled in the art that the second voltage V2 may be a common voltage Vcom, or another fixed level, for example, ground. Hereinafter, the present disclosure will be described by taking the first voltage V1 being Vss and the second voltage being a common voltage Vcom as an example, and it is obvious that the present disclosure is not limited thereto.

Figure 3:
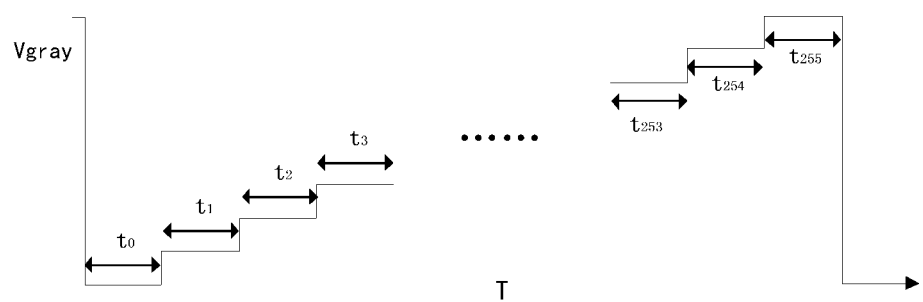
FIG. 3 illustrates an exemplary waveform diagram of grayscale voltages according to an embodiment of the present disclosure.

FIG. 3 illustrates an exemplary waveform diagram of grayscale voltages Vgray according to an embodiment of the present disclosure. As shown in FIG. 3, the vertical axis represents a level value of each grayscale voltage Vgray supplied to an input terminal of a third transistor T3 in a writing module 1201, and the horizontal axis refers to time. In an example of FIG. 3, by taking the image to be displayed comprising 256 gray levels as an example, amplitudes of the grayscale voltages Vgray correspond to the 256 gray levels respectively. A display time period of an image frame is equally divided into 256 periods $t_0$ to $t_{255}$. Assuming that the display time of the image frame is T seconds, i.e., (1/refresh rate), $t_0$ to $t_{255}$ are equal to T/256 seconds. In a first period $t_0$, a grayscale voltage Vgray supplied to an input terminal of a third transistor T3 is a grayscale voltage L0 corresponding to a gray level of 0, in a second period $t_1$, a supplied grayscale voltage Vgray is a grayscale voltage L1 corresponding to a gray level of 1, . . . and in a $256^{th}$ period $t_{255}$, a supplied grayscale voltage Vgray is a grayscale voltage L255 corresponding to a gray level of 255. In this way, the grayscale voltages increase progressively from L0 to L255 according to the driving timing. Of course, the present disclosure is not limited thereto, and the grayscale voltages Vgray may also decrease progressively from L255 to L0 according to the driving timing. In addition, the image to be displayed in the example has 256 gray levels, and an image having another number of gray levels may also be displayed as long as the magnitudes of the grayscale voltages correspond to the gray levels.

Figure 4:
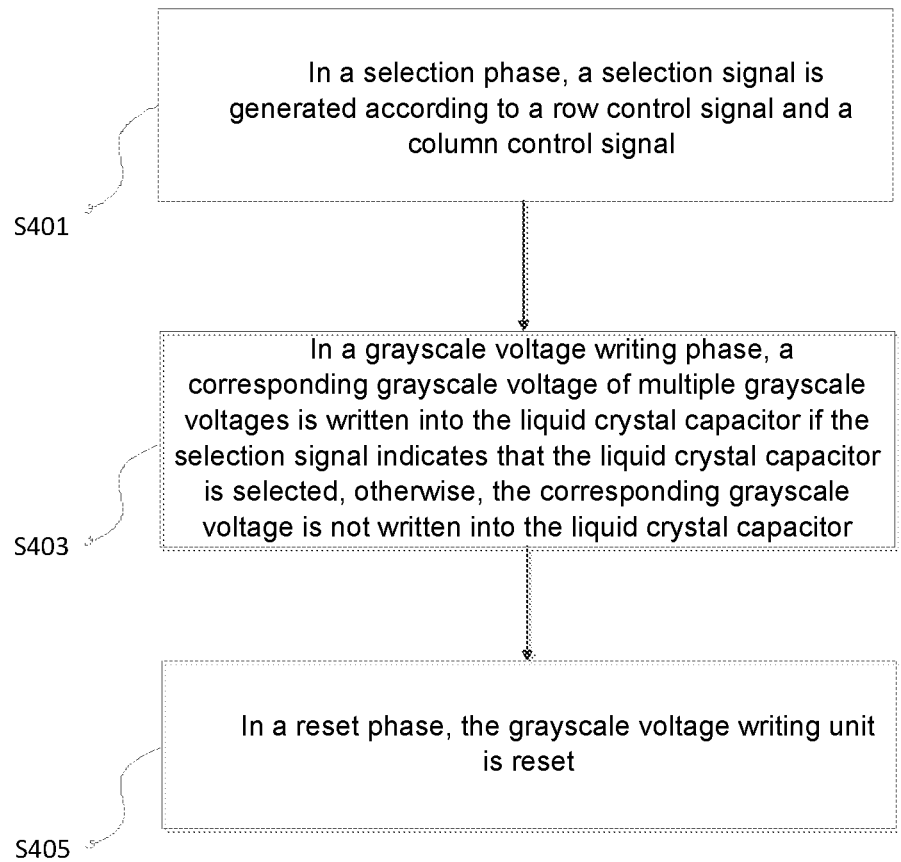
FIG. 4 illustrates a flowchart of a method for driving a pixel circuit according to an embodiment of the present disclosure.

FIG. 4 illustrates a flowchart of a method for driving a pixel circuit according to an embodiment of the present disclosure. As shown in FIG. 4, the method 40 for driving a pixel circuit according to the embodiment of the present disclosure may comprise the following steps.

In step 401, in a selection phase, a selection signal is generated according to a row control signal and a column control signal.

In step 403, in a grayscale voltage writing phase, a corresponding grayscale voltage of the multiple grayscale voltages is written into the liquid crystal capacitor if the selection signal indicates that the liquid crystal capacitor is selected. Otherwise, the corresponding grayscale voltage will not be written into the liquid crystal capacitor.

In step 405, in a reset phase, the grayscale voltage writing unit is reset.

The embodiments of the present disclosure further provide a display device comprising at least two pixel circuits according to the embodiment of the present disclosure.

According to the embodiment of the present disclosure, the display device may be a substrate, a display panel, an apparatus etc.

Figure 5:
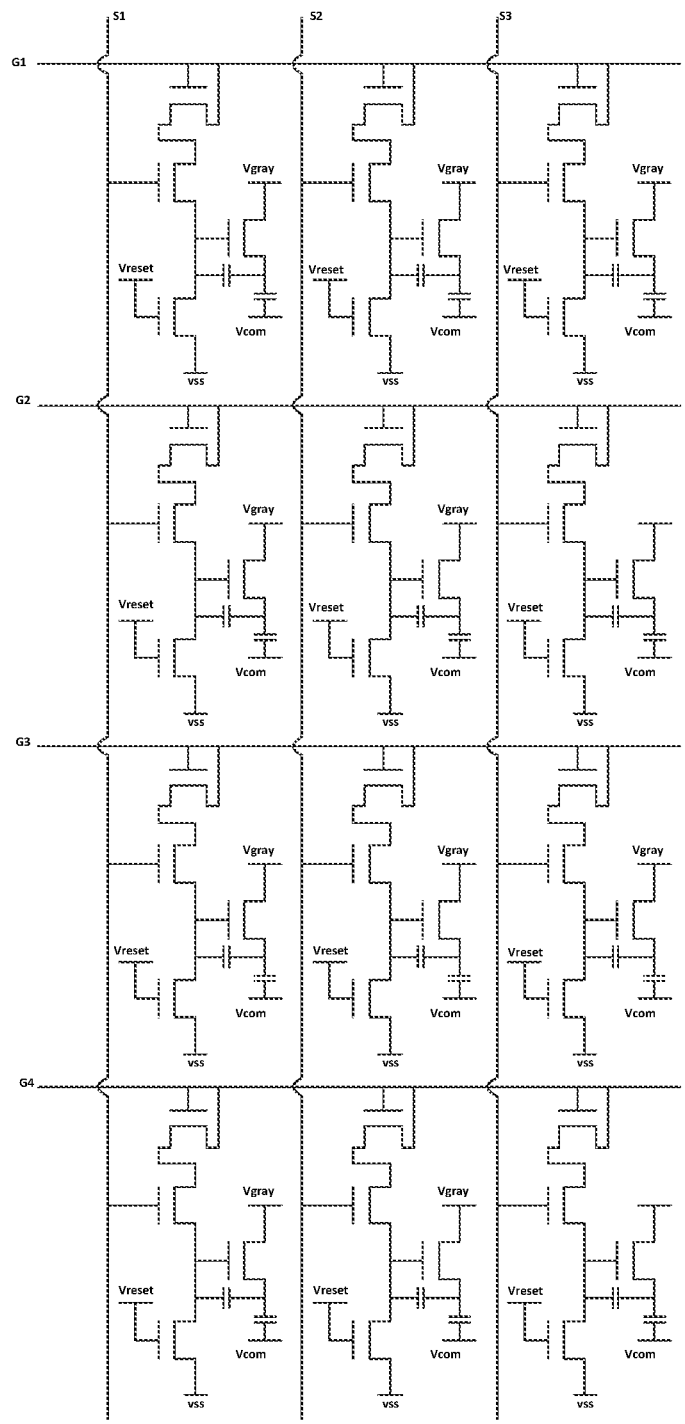
FIG. 5 illustrates an exemplary diagram of a display panel according to an embodiment of the present disclosure.

FIG. 5 illustrates an exemplary diagram of a display panel according to an embodiment of the present disclosure. As shown in FIG. 5, the display panel may comprise four row control lines G1 to G4, three column control lines S1 to S3, and pixel circuits provided at respective intersections of the row control lines G1 to G4 and the column control lines S1 to S3, wherein each pixel circuit has a structure of the pixel circuit according to the embodiment of the present disclosure. By taking a pixel circuit at an intersection of a row control line G1 and a column control line S1 as an example, a first transistor T1 has a control terminal and an input terminal connected to the row control line G1 and an output terminal connected to an input terminal of a second transistor T2, and a control terminal of T2 is connected to the column control line S1. A third transistor T3 has an input terminal for receiving a grayscale voltage Vgray, and an output terminal connected to a second terminal of a liquid crystal capacitor $C_{ld}$, and a first terminal of the liquid crystal capacitor $C_{ld}$ is connected to a common voltage Vcom. A fourth transistor T4 has a control terminal connected to a reset voltage line Vreset, and an output terminal connected to a low voltage Vss.

In the display panel shown in FIG. 5, for convenience of illustration, the present disclosure is described by taking the display panel comprising four row control lines (N=4) and three column control lines (M=3) as an example. It will be understood by those skilled in the art that the display panel according to the embodiment of the present disclosure may of course comprise other numbers of row control lines and column control lines, and the present disclosure is not limited thereto. For example, the display panel according to the embodiment of the present disclosure may comprise more row control lines and column control lines.

The embodiments of the present disclosure further provide a display device comprising a timing controller and the display device according to the embodiment of the present disclosure, wherein column control signals are generated by the timing controller according to an image to be displayed.

Next, the method for driving a pixel circuit according to the embodiment of the present disclosure will be described in detail with reference to FIGS. 2, 3, 4 and 5. The display panel comprises N row control lines and M column control lines, and the pixel circuit 10 for example shown in FIG. 2 is included at each of intersections of the N row control lines and the M column control lines. In a grayscale voltage writing phase, when the selection signal indicates that the liquid crystal capacitor is selected, a corresponding grayscale voltage of the multiple grayscale voltages is written into the liquid crystal capacitor, wherein a waveform diagram of the grayscale voltages is shown in FIG. 3.

Specifically, in a frame display period, a corresponding grayscale voltage $Vgray_i$ is to be displayed in a current period $t_1$. The period $t_1$ may comprise a selection phase, a grayscale voltage writing phase, and a reset phase.

In the selection phase, if the corresponding grayscale voltage $Vgray_i$ is required to be written into a pixel $P_{nm}$ on an $n^{th}$ row control line Gn and an $m^{th}$ column control line Sm according to the image to be displayed, where i is an integer greater than or equal to 1 and less than or equal to 256, N is an integer greater than or equal to 1 and less than or equal to N, and m is an integer greater than or equal to 1 and less than or equal to M, when a row control signal on the $n^{th}$ row control line is at a high level, i.e., an $n^{th}$ row is scanned, the first transistor T1 is turned on, and the output terminal of the first transistor T1 is at a high level. In this case, a column control signal corresponding to the column control line Sm is at a high level, and the second transistor T2 is turned on, thereby generating a selection signal at a high level.

Then, in the grayscale voltage writing phase, the high level of the output terminal of the first transistor T1 is output to the control terminal of the third transistor T3, that is, the selection signal at a high level is output to the third transistor T3, and the selection signal at a high level indicates that the liquid crystal capacitor $C_{ld}$ is selected, so that the third transistor T3 is turned on to start charging the liquid crystal capacitor $C_{ld}$. Thereby, the corresponding grayscale voltage $Vgray_i$ is written into the liquid crystal capacitor $C_{ld}$. At the same time, the first capacitor C1 is charged.

In the selection phase, if the corresponding grayscale voltage $Vgray_i$ is not required to be written into the pixel $P_{nm}$ in the $t_1$ period according to the image to be displayed, when the row control signal on the $n^{th}$ row control line is at a high level, i.e., the $n^{th}$ row is scanned, the first transistor T1 is turned on and the output terminal of the first transistor T1 is at a high level. In this case, the column control signal corresponding to the column control line Sm is at a low level, and the second transistor T2 is turned off, thereby generating a selection signal at a low level.

Then, in the grayscale voltage writing phase, the selection signal at a low level from the output terminal of the first transistor T1 is output to the control terminal of the third transistor T3, and the selection signal at a low level indicates that the liquid crystal capacitor $C_{ld}$ is not selected, so that the third transistor T3 is turned off. Therefore, the corresponding grayscale voltage $Vgray_i$ is not written into the pixel circuit $C_{ld}$.

In the reset phase, a reset voltage Vreset is applied to the control terminal of the fourth transistor T4 so that the fourth transistor T4 is turned on, and then the first capacitor C1 is discharged, thereby ensuring that the third transistor T3 is turned off.

In the above embodiment, the corresponding column control signal may be generated by the timing controller according to the image to be displayed.

FIG. 6 illustrates a flowchart of a method for driving a display device according to an embodiment of the present disclosure. As shown in FIG. 6, the method 60 for driving a display device according to the embodiment of the present disclosure may comprise the following steps.

In step 601, a respective corresponding grayscale voltage of multiple grayscale voltages is sequentially written into the liquid crystal capacitors in respective corresponding pixel circuits of multiple pixel circuits.

Amplitudes of the multiple grayscale voltages are in one-to-one correspondence with all gray levels of the image to be displayed, and all the multiple grayscale voltages are written sequentially in a frame period.

According to the embodiment of the present disclosure, by taking the grayscale voltages increasing progressively as an example, for an image frame to be displayed, in a period $t_0$, the timing controller determines positions of all pixels having a gray level of 0 in the image to be displayed, and generates corresponding column control signals according to the determined positions. In this period $t_0$, as shown in FIG. 7, the row control signals become an active high level row by row. When an $n^{th}$ row is scanned, column control signals of columns where all pixels having a gray level of 0 among image pixels in the $n^{th}$ row are at a high level, thereby generating selection signals indicating that a liquid crystal capacitor of a pixel having a gray level of 0 is selected, so that a grayscale voltage L0 corresponding to a gray level of 0 is written into corresponding liquid crystal capacitors.

Then, in a period $t_1$, the timing controller determines positions of all pixels having a gray level of 1 in the image to be displayed, and generates corresponding column control signals according to the determined positions. In this period $t_1$, the column control signals become an active high level row by row again. When an $n^{th}$ row is scanned, column control signals of columns where all pixels having a gray level of 1 among image pixels in the $n^{th}$ row are at a high level, thereby generating selection signals indicating that a liquid crystal capacitor of a pixel having a gray level of 1 is selected, so that a grayscale voltage L1 corresponding to a gray level of 1 is written into corresponding liquid crystal capacitors. Then, the process proceeds to period $t_2$ and so on, where similar operations will be performed accordingly. Finally, in a period $t_{255}$, the timing controller determines positions of all pixels having a gray level of 255 in the image to be displayed, and generates corresponding column control signals according to the determined positions. When an $n^{th}$ row is scanned, column control signals of columns where all pixels having a gray level of 255 among image pixels in the $n^{th}$ row are at a high level, thereby generating selection signals indicating that a liquid crystal capacitor of a pixel having a gray level of 255 is selected, so that a grayscale voltage L255 corresponding to a gray level of 255 is written into corresponding liquid crystal capacitors. Thus, display of an image frame is realized.

In a conventional progressive scanning display mode, when an image frame is displayed, gates of a first row of TFTs are turned on, data signals are written into source terminals of the first row of TFTs, and the gates of the first row are turned off after data is completely written (i.e., the pixel circuits are completely charged). Then, gates of a second row of TFTs are turned on, data signals are written, and so on, until the process proceeds to the last row. Therefore, a turn-on time of gates of each row is: 1/(refresh frequency*number of rows to be displayed)s. By taking a refresh frequency of 60 hz and a display resolution of 1920*1080 as an example, a charging time for each pixel is: 1/(60*1080)=15.43 us. The higher the display resolution is, the shorter the charging time is.

In the driving method according to the embodiment of the present disclosure, for an image frame to be displayed, for example, the pixel circuits may be sequentially charged in a manner in which grayscale voltages increase or decrease progressively with time. In comparison with the conventional manner in which the pixel circuits are charged in an order of fixed regions, with the pixel circuit and the method for driving the pixel circuit according to the embodiment of the present disclosure, the pixel circuits are sequentially charged according to the magnitudes of the grayscale voltages, a corresponding grayscale voltage is written into a pixel circuit at a corresponding position each time, and all the multiple grayscale voltages are written sequentially in a frame period. For example, in a case that grayscale values of the image to be displayed are in a range of 0 to 255, when the display panel displays an image frame, a corresponding grayscale voltage L0 may be firstly written into corresponding pixel circuits of all pixels having a gray level of 0 to be displayed in the display panel, then a corresponding grayscale voltage L1 is written into corresponding pixel circuits of all pixels having a gray level of 1 to be displayed in the display panel, and so on, until a corresponding grayscale voltage L255 is written into corresponding pixel circuits of all pixels having a gray level of 255 to be displayed. In a process of charging with a certain grayscale voltage, gate line TFTs and source line TFTs of the display panel are used only as switches, and therefore they may be turned on or off at a higher frequency. In a process of displaying a certain grayscale of the image frame, as only selection functions of the gate line TFTs and the source line TFTs are used, i.e., the gate line TFTs and the source line TFTs only play a switch role, when a certain row is being scanned, without waiting for data writing of this row to be completed, scanning of a next row may start. Therefore, after gates of a previous row of TFTs are turned off, the pixel electrodes may be turned on by themselves to complete a data writing process, thereby greatly improving the scanning speed. For the driving method according to the embodiment of the present disclosure, the charging time of each pixel is 1/(refresh rate*a number of grayscales), regardless of the display resolution, and a number of grayscales which are displayed is usually 256. By taking a refresh rate of 60 hz and a display resolution of 1920*1080 described above as an example, the charging time of the pixel according to the embodiment of the present disclosure is 1/(60*256)=65.10 us. For a higher resolution, the charging time is also 65.10 us, which greatly improves the charging time, and is beneficial to ensure the display quality. Therefore, the above-described technical solution according to the present disclosure is particularly applicable to ultra-high resolution large-scale display panels.

The method for driving a display device shown in FIG. 6 can be applied to a display device having the structure shown in FIG. 5. FIG. 7 illustrates a waveform diagram of row control signals according to an embodiment of the present disclosure, FIG. 8 illustrates an example of grayscale voltages of an image to be displayed according to an embodiment of the present disclosure, and FIGS. 9A to 9D illustrate an exemplary diagram of a driving timing of pixel circuits according to an embodiment of the present disclosure. Next, a method for driving a display device according to an embodiment of the present disclosure will be described in detail with reference to FIGS. 5 to 8 and FIGS. 9A to 9D. It will be understood by those skilled in the art that the following description is by way of example only and should not be construed as limiting the technical solutions of the present disclosure.

In the example of FIG. 8, the image to be displayed comprises 4 gray levels of 0, 1, 2 and 3 which increase progressively and correspond to grayscale voltages L0, L1, L2 and L3, respectively. In this example, the image is displayed by the display panel shown in FIG. 5, which comprises four row control lines and three column control lines, with a total of 4*3=12 pixel circuits.

Figure 9A:
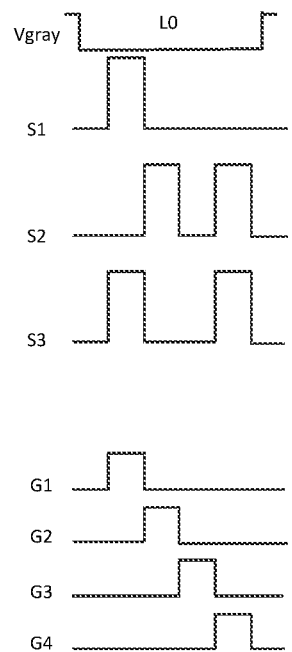
FIGS. 9A-9D illustrate an exemplary diagram of a driving timing of pixel circuits according to an embodiment of the present disclosure.

In this example, in a period $t_0$, positions of all the five pixels having a gray level of 0 in the image to be displayed as shown in FIG. 8 are determined according to the grayscale voltages of the image to be displayed, wherein the positions are (1,1), (1,3), (2,2), (4,2) and (4,3). As shown in FIG. 9A, when a first row is scanned, a row control signal G1 is at a high level, other row control signals are at a low level, and the timing controller outputs, according to the determined positions (1,1) and (1,3), a column control signal S1 at a high level to a first column control line, a column control signal S2 at a low level to a second column control line, and a column control signal S3 at a high level to a third column control line. Thereby, liquid crystal capacitors in pixel circuits respectively located at the pixels (1,1) and (1,3) are selected, so that a grayscale voltage L0 corresponding to the gray level of 0 is written into the liquid crystal capacitors in the pixel circuits located at the pixel (1,1) on the first row and a first column and the pixel (1,3) on the first row and a third column. When a second row is scanned, a row control signal G2 is at a high level, other row control signals are at a low level, and the timing controller outputs, according to the determined position (2,2), a column control signal S1 at a low level to the first column control line, a column control signal S2 at a high level to the second column control line, and a column control signal S3 at a low level to the third column control line. Thereby, a liquid crystal capacitor in a pixel circuit located at the pixel (2,2) is selected, so that the grayscale voltage L0 is written into the liquid crystal capacitor located at the pixel (2,2) on the second row and a second column. When a third row is scanned, a row control signal G3 is at a high level, other row control signals are at a low level, and the timing controller outputs, according to the determined positions not comprising a position of a pixel in the third row, column control signals S1 to S3 at a low level to the first column control line to the third column control line respectively. Thereby, in this phase, the grayscale voltage L0 is not written into any pixel circuit in the third row. When a fourth row is scanned, a row control signal G4 is at a high level, other row control signals are at a low level, and the timing controller outputs, according to the determined positions (4,2) and (4,3), a column control signal S1 at a low level to the first column control line, a column control signal S2 at a high level to the second column control line, and a column control signal S3 at a high level to the third column control line. Thereby, liquid crystal capacitors in pixel circuits located at the pixels (4,2) and (4,3) are selected, so that the grayscale voltage L0 is written into the liquid crystal capacitors located at the pixel (4,2) on the four row and the second column and the pixel (4,3) on the four row and the third column.

Figure 9B:
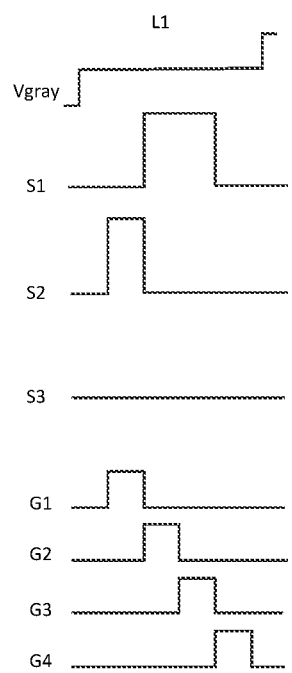

Then, in a next period $t_1$, positions of all the three pixels having a gray level of 1 in the image to be displayed as shown in FIG. 8 are determined according to the image to be displayed, wherein the positions are (1,1), (2,1) and (3,1). As shown in FIG. 9B, when the first row is scanned, the row control signal G1 is at a high level, other row control signals are at a low level, and the timing controller outputs, according to the determined position (1,2), a column control signal S1 at a low level to the first column control line, a column control signal S2 at a high level to the second column control line, and a column control signal S3 at a low level to the third column control line. Thereby, a liquid crystal capacitor in a pixel circuit located at the pixel (1,2) on the first row is selected, so that a grayscale voltage L1 corresponding to the gray level of 1 is written into the liquid crystal capacitor in the pixel circuit located at the pixel (1,2) on the first row and the second column. When the second row is scanned, the row control signal G2 is at a high level, other row control signals are at a low level, and the timing controller determines, according to the determined position (2,1), a column control signal S1 at a high level to the first column control line, and column control signals S2 and S3 at a low level to the second column control line and the third column control line. Thereby, a liquid crystal capacitor in a pixel circuit located at the pixel (2,1) is selected, so that the grayscale voltage L1 is written into the liquid crystal capacitor located at the pixel (2,1) on the second row and the first column. When the third row is scanned, a row control signal G3 is at a high level, other row control signals are at a low level, and the timing controller outputs, according to the determined position (3,1), a column control signal S1 at a high level to the first column control line, and column control signals S2 and S3 at a low level to the second column control line and the third column control line. Thereby, a liquid crystal capacitor in a pixel circuit located at the pixel (3,1) is selected, so that the grayscale voltage L1 is written into the liquid crystal capacitor located at the pixel (3,1) on the third row and the first column. When the fourth row is scanned, a row control signal G4 is at a high level, other row control signals are at a low level, and the timing controller outputs, according to the determined positions not comprising a position of a pixel in the fourth row, column control signal S1 to S3 at a low level to the first column control line to the third column control line respectively. Thereby, in this phase, the grayscale voltage L1 is not written into any pixel circuit in the fourth row.

Figure 9C:
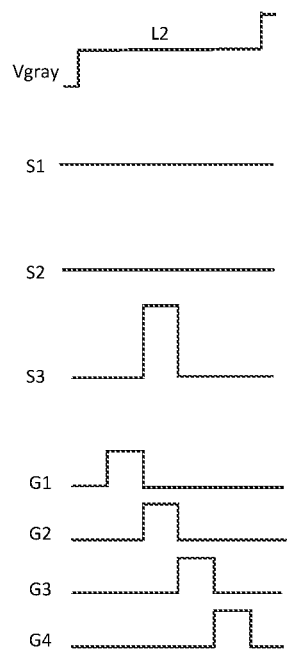

Then, in a next period $t_2$, a position of all the one pixel having a gray level of 2 in the image to be displayed as shown in FIG. 8 is determined according to the image to be displayed, wherein the position is (2,3). As shown in FIG. 9C, when the first row is scanned, the timing controller outputs, according to the determined position not comprising a position of a pixel in the first row, column control signal S1 to S3 at a low level to the first column control line to the third column control line respectively. Thereby, in this phase, a grayscale voltage L2 corresponding to the gray level of 2 is not written into any pixel circuit in the first row. When the second row is scanned, a row control signal G2 is at a high level, other row control signals are at a low level, and the timing controller outputs, according to the determined position (2,3), column control signals S1 and S2 at a low level to the first column control line and the second column control line respectively, and a column control signal S3 at a high level to the third column control line. Thereby, a liquid crystal capacitor in a pixel circuit located at the pixel (2,3) is selected, so that the grayscale voltage L2 is written into the liquid crystal capacitor in the pixel circuit located at the pixel (2,3) on the second row and the third column. When the third row and the fourth row are scanned, the timing controller outputs, according to the determined positions not comprising a position of a pixel in the third row and the fourth row, column control signals S1 to S3 at a low level to the first column control line to the third column control line respectively. Thereby, in this phase, the grayscale voltage L2 is not written into any pixel circuit in the third row and the fourth row.

Figure 9D:
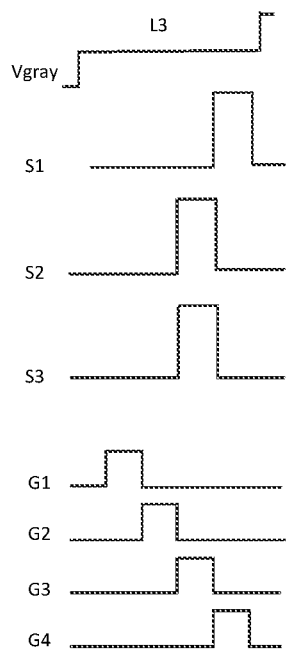

Then, in a next period $t_3$, positions of all the three pixels having a gray level of 3 in the image to be displayed as shown in FIG. 8 are determined according to the image to be displayed, wherein the positions are (3,2), (3,3) and (4,1). As shown in FIG. 9D, when the first row and the second row are scanned, the timing controller outputs, according to the determined positions not comprising a position of a pixel in the first row and the second row, column control signals S1 to S3 at a low level to the first column control line to the third column control line respectively. Thereby, a grayscale voltage L3 corresponding to the gray level of 3 is not written into a liquid crystal capacitor in any pixel circuit on the first row and the second row. When the third row is scanned, a row control signal G3 is at a high level, other row control signals are at a low level, and the timing controller outputs, according to the determined positions (3,2) and (3,3), a column control signal S1 at a low level to the first column control line, a column control signal S2 at a high level to the second column control line and a column control signal S3 at a high level to the third column control line. Thereby, liquid crystal capacitors in pixel circuits located at the pixels (3,2) and (3,3) are selected, so that the grayscale voltage L3 is written into the liquid crystal capacitors located at the pixel (3,2) on the third row and the second column and the pixel (3,3) on the third row and the third column. When the fourth row is scanned, a row control signal G4 is at a high level, other row control signals are at a low level, and the timing controller outputs, according to the determined position (4,1), a column control signal S1 at a high level to the first column control line, a column control signal S2 at a low level to the second column control line, and a column control signal S3 at a high level to the third column control line. Thereby, a liquid crystal capacitor in a pixel circuit located at the pixel (4,1) on the fourth row is selected, so that the grayscale voltage L3 is written into the liquid crystal capacitor located at the pixel (4,1) on the fourth row and the first column. In this way, display of an image frame is realized.

Although the above example has been described by taking the image to be displayed comprising four grayscale values and the display panel having four row control lines and three column control lines as an example, based on the embodiments of the present disclose, various other modifications are also obvious to those skilled in the art.

In addition, it will be appreciated by those skilled in the art that, although the timing controller generates the corresponding column control signals according to the image to be displayed in the example, the column control signals may also be generated in any other manner known in the art, as long as a corresponding grayscale voltage can be written into corresponding pixel circuits each time and all the grayscale voltages are written sequentially in a frame period under the control of the column control signals and the row control signals. In addition, although the example is described by using progressive scanning as an example, an interlaced scanning manner may also be used as long as a corresponding grayscale voltage can be written into pixel circuits at corresponding positions based on a gray level of the image to be displayed.

According to the technical solutions of the embodiments of the present disclosure, for example, the timing controller is used to generate the corresponding column control signals according to the image to be displayed, and under the control of the row control signals and the column control signals, the conventional driving method in which progressive charging is performed is changed to a driving method in which charging per grayscale voltage rather than sequential charging at fixed positions is performed, thereby increasing the charging time of the pixel circuits and improving the charging rate.

The display apparatus according to the embodiments of the present disclosure may be any product or component having a display function such as a mobile phone, a tablet computer, a television set, a display, a notebook computer, a digital photo frame, a navigator etc.

The purposes, technical solutions and beneficial effects of the present disclosure have been described in further detail by the specific embodiments as described above. It should be understood that the foregoing description is only of the specific embodiments of the present disclosure and is not intended to limit the present disclosure. Any modifications, equivalent substitutions, improvements, etc. within the spirit and principles of this disclosure are intended to be included within the protection scope of the present disclosure.

The present disclosure has been described in connection with the preferred embodiments. It should be understood that various other changes, substitutions and additions may be made by those skilled in the art without departing from the spirit and scope of the present disclosure. Therefore, the scope of the present disclosure is not limited to the specific embodiments described above, but should be defined by the appended claims.

We claim:

1. A pixel circuit, comprising:
a liquid crystal capacitor;
a selection unit having a first input terminal for receiving a row control signal and a second input terminal for receiving a column control signal, and configured to generate a selection signal indicating whether to select the liquid crystal capacitor according to both the row control signal and the column control signal, and to output the selection signal via an output terminal of the selection unit; and
a grayscale voltage writing unit having a first input terminal connected to the output terminal of the selection unit, a second input terminal for receiving multiple grayscale voltages, a first output terminal connected to a first terminal of the liquid crystal capacitor, and a second output terminal connected to a first voltage, and configured to write a corresponding grayscale voltage of the multiple grayscale voltages into the liquid crystal capacitor when the selection signal indicates that the liquid crystal capacitor is selected.

2. The pixel circuit according to claim 1, wherein a lowest grayscale voltage among the multiple grayscale voltages has a magnitude of 0, and a highest grayscale voltage among the multiple grayscale voltages has a magnitude corresponding to a highest gray level of an image to be displayed.

3. The pixel circuit according to claim 1, wherein the column control signal depends on a gray level of an image to be displayed.

4. The pixel circuit according to claim 1, wherein the grayscale voltage writing unit comprises a writing module and a reset module, wherein
the writing module has a control terminal connected to the output terminal of the selection unit, an input terminal for receiving the corresponding grayscale voltage, and an output terminal connected to the first terminal of the liquid crystal capacitor; and
the reset module has an input terminal for receiving a reset voltage, and an output terminal connected to the writing module, and is configured to reset the writing module under the control of the reset voltage.

5. The pixel circuit according to claim 1, wherein the selection unit comprises a first thin film transistor (TFT) and a second TFT, wherein the first TFT has a control terminal and an input terminal both connected to the row control signal, and an output terminal connected to an input terminal of the second TFT, and the second TFT has a control terminal connected to the column control signal, and an output terminal connected to the first input terminal of the grayscale voltage writing unit for outputting the selection signal.

6. The pixel circuit according to claim 4, wherein:
the writing module comprises a third TFT having a control terminal connected to the output terminal of the second TFT, an input terminal for receiving the corresponding grayscale voltage, and an output terminal connected to the first terminal of the liquid crystal capacitor;
a second terminal of the liquid crystal capacitor is connected to a second voltage;
the reset module comprises a fourth TFT and a first capacitor, wherein the fourth TFT has a control terminal for receiving the reset voltage, an input terminal connected to both the first terminal of the first capacitor and the output terminal of the second TFT, and an output terminal connected to the first voltage; and a second terminal of the first capacitor is connected to both the first terminal of the liquid crystal capacitor and the output terminal of the third TFT.

7. A display device, comprising at least two pixel circuits according to claim 1.

8. A display apparatus comprising a timing controller and the display device according to claim 7, wherein the timing controller generates the column control signal according to an amplitude order of the grayscale voltages to be written to the liquid crystal capacitors of the pixel circuits of the display device.

9. A method for driving the pixel circuit according to claim 1, comprising:
   in a selection phase, generating the selection signal according to the row control signal and the column control signal;
   in a grayscale voltage writing phase, writing a corresponding grayscale voltage of multiple grayscale voltages to the liquid crystal capacitor if the selection signal indicates that the liquid crystal capacitor is selected, otherwise, not writing the corresponding grayscale voltage to the liquid crystal capacitor; and
   in a reset phase, resetting the grayscale voltage writing unit.

10. The method according to claim 9, wherein the selection unit comprises a first TFT and a second TFT, and the grayscale voltage writing unit comprises a third TFT, a fourth TFT and a first capacitor, wherein:
   in the selection phase, the first TFT is turned on, and the second TFT is turned on, so that the selection signal indicating that the liquid crystal capacitor is selected is generated;
   in the grayscale voltage writing phase, the third TFT is turned on due to the selection signal, so that the corresponding grayscale voltage is written into the liquid crystal capacitor; and
   in the reset phase, when a reset voltage is applied to the fourth TFT, the fourth TFT is turned on to cause the first capacitor to discharge, so that the third TFT is turned off,
   wherein the reset voltage is applied each time the corresponding grayscale voltage changes.

11. The method according to claim 9, wherein the selection unit comprises a first TFT and a second TFT, and the grayscale voltage writing unit comprises a third TFT, a fourth TFT and a first capacitor, wherein:
   in the selection phase, the first TFT is turned on, and the second TFT is turned off, so that the selection signal indicating that the liquid crystal capacitor is not selected is generated;
   in the grayscale voltage writing phase, the third TFT is turned off due to the selection signal, so that the corresponding grayscale voltage is not written into the liquid crystal capacitor; and
   in the reset phase, when a reset voltage is applied to the fourth TFT, the fourth TFT is turned on to cause the first capacitor to discharge, so that the third TFT is turned off,
   wherein the reset voltage is applied each time the corresponding grayscale voltage changes.

12. A method for driving the display device according to claim 7, comprising:
   sequentially providing the multiple grayscale voltages to the second input terminals of the grayscale voltage writing units of the pixel circuits according to an amplitude order of the grayscale voltages to be written into the liquid crystal capacitors of the pixel circuits of the display device,
   wherein amplitudes of the multiple grayscale voltages are in one-to-one correspondence with all gray levels of the image to be displayed, and all the multiple grayscale voltages are written sequentially in a frame period.

13. A display device, comprising at least two pixel circuits according to claim 4.

14. A display device, comprising at least two pixel circuits according to claim 5.

15. A display device, comprising at least two pixel circuits according to claim 6.

16. A display apparatus comprising a timing controller and the display device according to claim 13, wherein the timing controller generates the column control signal according to an amplitude order of the grayscale voltages to be written into the liquid crystal capacitors of the pixel circuits of the display device.

17. A display apparatus comprising a timing controller and the display device according to claim 14, wherein the timing controller generates the column control signal according to an amplitude order of the grayscale voltages to be written into the liquid crystal capacitors of the pixel circuits of the display device.

18. A display apparatus comprising a timing controller and the display device according to claim 15, wherein the timing controller generates the column control signal according to an amplitude order of the grayscale voltages to be written into the liquid crystal capacitors of the pixel circuits of the display device.

19. A method for driving the display device according to claim 13, comprising:
   sequentially providing the multiple grayscale voltages to the second input terminals of the grayscale voltage writing units of the pixel circuits according to an amplitude order of the grayscale voltages to be written into the liquid crystal capacitors of the pixel circuits of the display device,
   wherein amplitudes of the multiple grayscale voltages are in one-to-one correspondence with all gray levels of the image to be displayed, and all the multiple grayscale voltages are written sequentially in a frame period.

20. A method for driving the display device according to claim 14, comprising:
   sequentially providing the multiple grayscale voltages to the second input terminals of the grayscale voltage writing units of the pixel circuits according to an amplitude order of the grayscale voltages to be written into the liquid crystal capacitors of the pixel circuits of the display device,
   wherein amplitudes of the multiple grayscale voltages are in one-to-one correspondence with all gray levels of the image to be displayed, and all the multiple grayscale voltages are written sequentially in a frame period.

* * * * *